United States Patent
Saeki

(10) Patent No.: US 6,753,712 B2
(45) Date of Patent: Jun. 22, 2004

(54) CLOCK AND DATA RECOVERY CIRCUIT AND CLOCK CONTROL METHOD THEREOF

(75) Inventor: Takanori Saeki, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/427,928

(22) Filed: May 2, 2003

(65) Prior Publication Data

US 2003/0214335 A1 Nov. 20, 2003

(30) Foreign Application Priority Data

May 17, 2002 (JP) .................................... 2002-142535

(51) Int. Cl.$^7$ ................................................ H03K 3/84
(52) U.S. Cl. ........................................ 327/165; 327/164
(58) Field of Search ................................ 327/165, 164, 327/166, 167, 158, 161; 331/135

(56) References Cited

U.S. PATENT DOCUMENTS 6,122,336 A * 9/2000 Anderson .................... 375/371
6,380,774 B2 * 4/2002 Saeki ......................... 327/119

FOREIGN PATENT DOCUMENTS

JP 2002-190724 7/2002

OTHER PUBLICATIONS

A. Fiedler et al., "A 1.0625Gbps Transceiver with 2x–Oversampling and Transmit Signal Pre–Emphasis", ISSCC 1997 pp. 238–239.

* cited by examiner

Primary Examiner—Linh M. Nguyen
(74) Attorney, Agent, or Firm—Young & Thompson

(57) ABSTRACT

A clock and data recovery circuit includes a phase-shift circuit having a switch, which receives multiphase clocks, for selecting and outputting a plurality of clock pairs from among the multiphase clocks, and a plurality of interpolators, which receive the plurality of clock pairs output from the switch, for outputting clock signals in which delay time is stipulated by time obtained by performing interior division of the phase difference between the clocks of the pair; a plurality of latch circuits which receive input data in common; a phase detecting circuit for detecting and outputting phase, with respect to the clock, of a transition point of the input data from the outputs of the plurality of latch circuits; a filter for smoothing the output of the phase detecting circuit; and a control circuit for controlling clock phase by outputting control signals for controlling the interpolators and/or switch of the phase-shift circuit based upon the filter output.

15 Claims, 12 Drawing Sheets

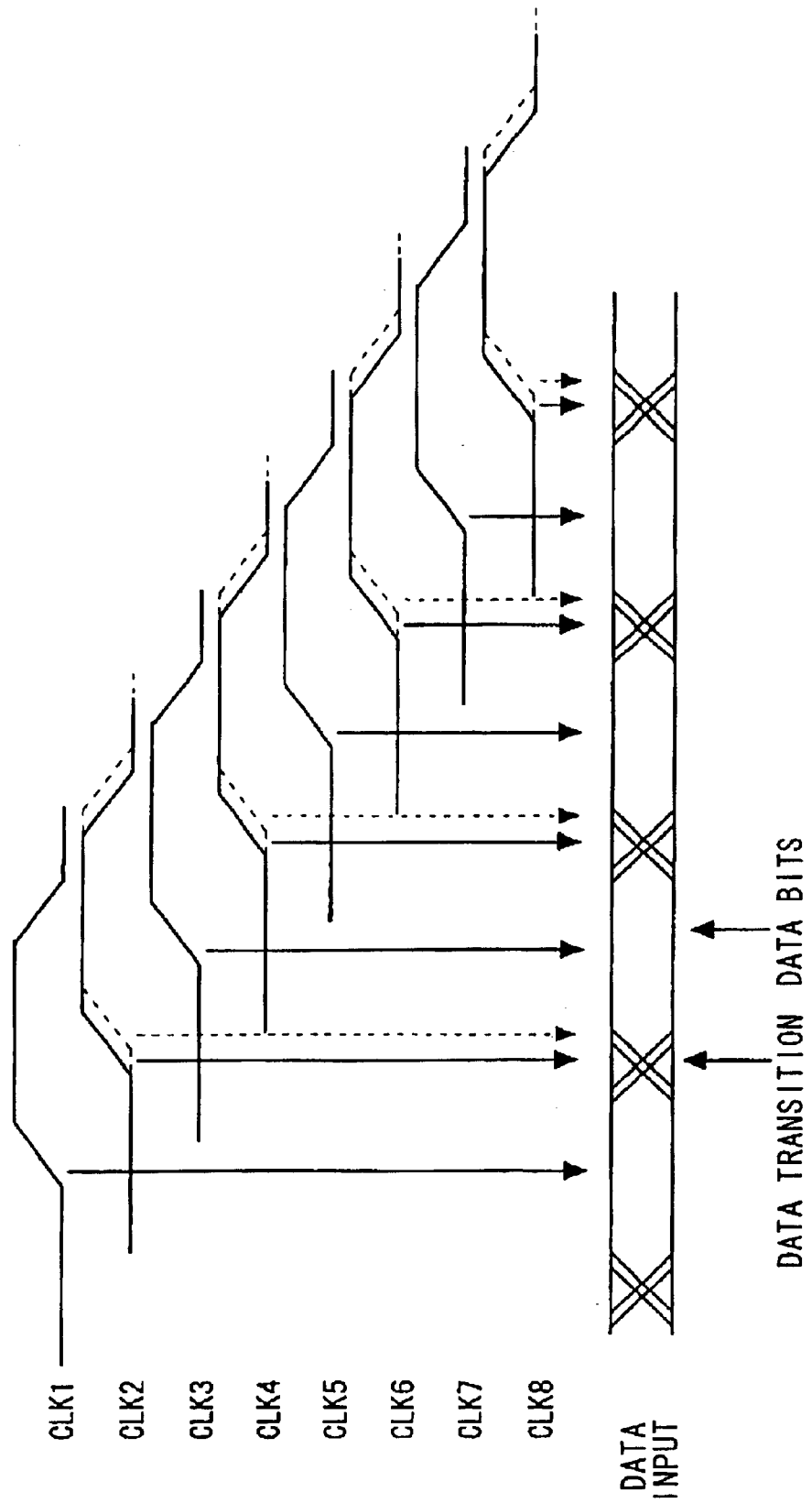

tA  tB  tC  tD  tE  tF  tG

EDGE DETECTED

| | tA | tB | tC | tD | tE | tF | tG |
|---|---|---|---|---|---|---|---|
| S0 | 0 | 0 | 0 | 0 | 0 | 0 | 0 |
| S1 | 0 | 0 | 0 | 0 | 0 | 0 | 0 |
| S2 | 0 | 0 | 0 | 0 | 0 | 0 | 0 |
| S3 | 0 | 0 | 1 | 0 | 1 | 0 | 1 | 0 |
| S4 | 1 | 1 | 1 | 1 | 1 | 1 | 1 |
| S5 | 1 | 1 | 1 | 1 | 1 | 1 | 1 |
| S6 | 1 | 1 | 1 | 1 | 1 | 1 | 1 |
| S7 | 1 | 1 | 1 | 1 | 1 | 1 | 1 |

DATA LATCHED

TIME ⟶

| | | | | | | | |
|---|---|---|---|---|---|---|---|
| S0' | 0 | 0 | 0 | 0 | 0 | 0 | 0 |
| S1' | 0 | 0 | 0 | 0 | 0 | 0 | 0 |
| S2' | 0 | 0 | 0 | 0 | 0 | 0 | 0 |
| S3' | 0 | 0 | 0 | 0 | 0 | 0 | 0 |
| S4' | 1 | 1 | 1 | 1 | 1 | 1 | 1 |
| S5' | 1 | 1 | 1 | 1 | 1 | 1 | 1 |
| S6' | 1 | 1 | 1 | 1 | 1 | 1 | 1 |
| S7' | 1 | 1 | 1 | 1 | 1 | 1 | 1 | ns
CLOCK AND DATA RECOVERY CIRCUIT AND CLOCK CONTROL METHOD THEREOF

FIELD OF THE INVENTION

This invention relates to a clock and data recovery circuit and clock control method thereof.

BACKGROUND OF THE INVENTION

FIG. 8 is a diagram illustrating the structure of a clock and data recovery circuit according to the prior art. As shown in FIG. 8, the clock and data recovery circuit has a voltage-controlled oscillator (VCO) 51 of a PLL (phase Locked Loop) which generates a multiphase clock (multiphase output) of equally spaced phase differences from a reference clock (Ref CLK) applied thereto. The VCO comprises an analog ring oscillator, which is composed by an odd-number of inverter circuits connected into a ring-shaped configuration. A multiphase clock of equally spaced phase differences is extracted differentially from the outputs of differential inverting circuits constructing the ring oscillator. The clock and data recovery circuit has a plurality of flip-flops 52 (F/F1 to F/F8), which have data input terminals for receiving the input data DATA commonly and clock input terminals for receiving respective clock signals of the multiphase clock output from the VCO 51. The flip-flop 52 samples and outputs the input data DATA at a rising or falling edge of the clock signal fed to the clock input terminal.

This clock and data recovery circuit has a counter 53, which receives the data output from each of the plurality of flip-flops 52 (F/F1 to F/F8), and which counts the logic value of the data up and down, and a filter 55 which performs time-averaging of the output of the counter 53 over a predetermined time constant. The output voltage of the filter 55 is supplied as the control voltage of the VCO 51. Some or all of the outputs of the flip-flops 52 and one phase of the clock output from the VCO 51 are output as data and a clock signal. The outputs of the plurality of flip-flops (F/F1 to F/F8) are the result of sampling the data DATA by clock signals phase-shifted in small increments. The sampled waveform obtained is the result of sampling the data DATA at a frequency that is eight times the frequency of the reference clock signal. The timing of the clock signal of a flip-flop for which the output value does not agree with the output value of the neighboring flip-flop is the transition point of the data DATA (this point is also referred to as the "data changeover portion").

If the clock signal lags with respect to the data transition time point (i.e., if latch timing is lagging), the value of the counter 53 is counted up to advance the phase of the clock signal. If the clock leads the data transition time point (i.e., if the latch timing is leading), the value of the counter 53 is counted down to delay the phase of the clock signal. It should be noted that the counter 53 may comprise a charge pump (CP) for charging a capacitor with a constant current when the output value of each of the plurality of flip-flops (F/F1 to F/F8) is logic "0", and discharging the capacitor with a constant current when the output value is logic "1".

See Reference 1 (ISSCC 1997 pp. 238–239, Alan Fiedler, "A 1.0625 Gbps Transceiver with 2x-Oversampling and Transmit Signal Pre-Emphasis"), which is an example of the clock and data recovery circuit shown in FIG. 8. The clock and data recovery circuit described in Reference 1 has a receiver circuit for recovering a clock and data from input data and outputting resulting data as parallel data. The VCO of a PLL (Phase-Locked Loop) has a 10-delay-stage ring oscillator, and the VCO 20 clock phases provide 2x oversampling clock signals to the receiver circuit to recover a clock and data. The receiver circuit locks the VCO to the input data and recovers a clock from an NRZ (Non-Return to Zero) transition. The clock and data recovery circuit described in Reference 1 has a data phase detector that comprises a plurality of high-speed latches and exclusive-OR gates for detecting coincidence/non-coincidence of the high-speed latches. A Latch that samples data bits is clocked by the non-inverted clock signal of the VCO, and a latch that samples the boundary between data bits is clocked by the inverted clock signal of the VCO.

In the conventional circuit shown in FIG. 8, the multiphase clock is generated by the VCO, and a phase interpolator comprising an analog circuit is used as an interpolator.

In the specification of Japanese Patent Application No. 2000-389526 (Japanese Patent Kokai Publication JP-A-P2002-190724A), the present Inventor proposes an arrangement, which is shown in FIG. 9, as a clock and data recovery circuit for facilitating a change in frequency range, facilitating adjustment of characteristics and varying the number of parallel data and clock outputs. This clock and data recovery circuit comprises a plurality of latch circuits 102 to which input data is supplied in common; a phase-shift circuit 101A for generating clock signals, which are phase-shifted from one another, supplied to respective ones of the latch circuits; a counter 103 the count of which is counted up and down based upon the outputs of the plurality of latch circuits 102; a filter 105 for smoothing the output of the counter 103; and a decoder 106 which receives the output of the filter 105 as an input, and decodes the received signal to deliver a signal, which controls the phases of the clock signals, to the phase-shift circuit 101A. On the basis of the output from filter 105, the decoder 106 delays the phases of clock signals CKL1 to CLK8 incrementally whenever the output of counter 103 is incremented.

The clock and data recovery circuit shown in FIG. 9 latches data successively phase by phase using a multiphase clock (eight phases in FIG. 9) the frequency of which is less than that of the data rate. The relationship among the data rate, the frequency of the multiphase clock and the number of phases generally is expressed as follows in approximate fashion:

(data rate)=(frequency of multiphase clock)×(number of phases)/(K)

where K represents a number indicating the number of clock phases by which the width of one bit of data is clocked. In the implementation of FIG. 9, K=2 holds. More specifically, as indicated in the timing diagram of FIG. 11, the data transition time point (the data changeover portion that is the boundary between data bits in the case of the NRZ waveform) and data bit (value of the data) are sampled at two phases.

In the circuit shown in FIG. 9, the results of latching the width of one bit of data at the edges of a plurality of clock signals are compared using the up/down counter 103, thereby detecting the transition time point at which the data changes, phase lead/lag of the data and clock is discriminated, and a signal specifying up (for advancing the clock relative to the data) or down (for delaying the clock relative to the data) is output.

The output of the up/down counter 103 is supplied to the filter circuit 105. The latter operates on the up/down signal and, if the magnitude of count-up, count-down exceeds a fixed value, outputs a signal to the decoder 106 so as to advance or delay the clock phase.

This conventional clock and data recovery circuit is so adapted that the clock signals of the multiphase clock are shifted in unison in the phase-shift circuit 101A.

FIG. 10 is a diagram illustrating the structure of the phase-shift circuit 101A depicted in FIG. 9. As shown in FIG. 10, the phase-shift circuit 101A comprises a switch 110, to which the 8-phase clock is input, for selecting and outputting a plurality of pairs of two mutually adjacent clock signals from the 8-phase clock, and a plurality of interpolators 111 (Int. 1 to Int. 8), which receive plurality of clock pairs output from the switch 110, and output signals in which delay time is stipulated by time obtained by performing interior division of the phase difference between the clock signals of the pair. In a case where the output of the counter 103 is, e.g., eight bits, a signal U of, e.g., the four higher order bits at the output of the decoder 106 is used to control changeover of the switch 110, and a signal S of the four lower order bits at the output of the decoder 106 is used to control the 16-step interpolator 111, which is described below. A 16-step control signal output supplied to the interpolator 111 undergoes a thermometer-type shift. In a case where it is necessary to delay or advance phase with the 16-bit control signal being all "1"s or all "0"s, the switch 110 is changed over.

The control signal S supplied from the decoder 106 is applied as the common signal to the eight interpolators 111 (Int. 1 to Int. 8). All eight phases of the clock signals are shifted in unison at equal intervals in accordance with the control signal S.

The solid lines in the timing diagram of FIG. 11 represent the original 8-phase clock signals (CLK1 to CLK8) output from the interpolator 111 of FIG. 10, and the dashed lines indicate the 8-phase clock signals after being shifted in phase. As illustrated in FIG. 11, the 8-phase clock signals output from the interpolator 111 are shifted in unison at equal intervals.

An overview of the interpolator 111 shown in FIG. 10 will now be described. FIG. 12A is a diagram illustrating an example of the interpolator structure, and FIG. 12B is a diagram useful in describing the operating principle of the interpolator, namely internal division of phase difference. The interpolator having the structure of FIG. 12A is such that output timing varies in proportion to the driving capability of inverters arranged in parallel. Let N represent the number of inverters INV1 rendered active or inactive by a control signal $\phi$ (N is 16 in the case of a 16-step interpolator), and let N represent the number of inverters INV2 rendered active or inactive by an inverted control signal $\phi^-$ obtained by inverting the control signal $\phi$. Each of the parallel-connected inverters INV1 is represented by a single inverter and each of the parallel-connected inverters INV2 is represented by a single inverter in FIG. 12A. The inverter INV1 is such that a switch (not shown) inserted between a CMOS inverter constituting the inverter INV1 and a power-supply path is turned on when the control signal $\phi$ is at the high level, and the inverter INV2 is such that a switch (not shown) inserted between a CMOS inverter constituting the inverter INV2 and a power-supply path is turned on when the control signal $\phi^-$ is at the high level. The output terminals of the inverters INV1 and INV2 are tied together and connected to the input terminal of an inverter INV3.

Let C represent the capacitance at the connection node of the output terminals of the inverters INV1 and INV2, N-number of each of which are provided in parallel. When input signals to the inverters INV1 and INV2 are both at the low level, the input node of the inverter INV3 assumes the high power-supply potential (high level). Let CV represent the amount of electric charge to be discharged from the connection node (capacitance C) until the output OUT of the inverter INV3 inverts, and let I represent the discharge current of the inverters INV1, INV2. If n-number ($0 \leq n \leq N$) of the control signals $\phi$ are placed at the high level and, hence, (N−n)-number of the inverted control signals $\phi^-$ are placed at the high level, then n-number of the inverters INV1 and (N−n)-number of the inverters INV2 will be activated. The n-number of inverters INV1 discharge the accumulated charge in the capacitance C at a current n I I for a time T at the rising edge of input signal IN1, whereby the electric charge in the capacitance becomes CV−n×IT, where T represents the time difference (phase difference) between the rising edges of input signals IN1 and IN2. Furthermore, n-number of the inverters INV1 and (N−n)-number of inverters INV2 discharge the accumulated charge of the capacitance C at a discharge current N×I at the rising edge of the input signal IN2 following elapse of the time T from the rising edge of input signal IN1.

Accordingly, the charge becomes (CV−n×IT)/N×I starting from a rising edge of the input signal IN2 for a period of time until the output of the inverter INV3 inverts. In other words, the propagation delay time tpd from the rising edge of input signal IN1 to the rising edge of the output signal of inverter INV3 is given by Equation (2) below.

$$tpd = T + CV/N \times I - n \times T/N \qquad (2)$$

That is, at n=N, the propagation delay time tpd is minimized and is given by CV/N×I (see OUT1 in FIG. 12B). At n=0, the propagation delay time tpd is maximized and is given by T+CV/N×I (see OUT3 in FIG. 12B). If n is a value that falls within the range between 1 and N−1, the delay time tpd is stipulated by a time obtained by performing interior division of the phase difference T between the input signals IN1 and IN2 at an internal division ratio 1−x:x (where x=n/N) (see OUT2 in FIG. 12B). In the case of a 16-step interpolator, N=16 holds and the control signal $\phi$ is composed of four bits. Similarly, in the case of a 256-step interpolator, N=256 holds and the control signal $\phi$ is composed of eight bits.

SUMMARY OF THE DISCLOSURE

Thus, with the clock and data recovery circuit described above with reference to FIGS. 9 to 12, the control signal supplied from the decoder 106 is applied commonly to the plurality of interpolators 111 in the phase-shift circuit 101A, and all of the multiphase clock signals are shifted in unison at regular intervals at a prescribed phase in dependence upon the control signal.

As a consequence, if the phase of the clock situated in the data changeover portion is shifted in a case where the timing of the data transition point shifts owing to jitter, etc., of the input data, then the phase of the clock of another phase for sampling the value of the data bit also is shifted by the same amount. Hence, there is a greater possibility that data of the correct value will no longer be able to be sampled. For example, if the phase of the data transition point is delayed in a certain cycle owing to jitter of the input data or the like in a case where the data transition and the content of the data bit are being sampled by two phases, then there will also be a case where the phase of the data transition point is advanced in the next cycle (i.e., one cycle is shortened). In a case where the clock for detecting data transition and the clock for sampling the data bit are delayed by the same amount of phase, there will be a case where the data transition region (boundary between the data bits) of a succeeding cycle is sampled as the data bit. Thus, there are instances where the data bit cannot be sampled correctly.

Accordingly, it is an object of the present invention to provide a clock and data recovery circuit and method that make it possible to suppress the effects of jitter components and to sample data accurately.

The above and other objects are attained by a clock and data recovery circuit, in accordance with one aspect of the present invention, which comprises: a phase-shift circuit having a switch, to which a plurality of clock signals (referred to as a "multiphase clocks") of mutually different phases are supplied, and which selects and outputs a plurality of clock pairs from among the multiphase clocks, and a plurality of interpolators, to which the plurality of clock pairs output from the switch are supplied, for outputting signals in which delay time is stipulated by time obtained by performing interior division of the phase difference between the clock signals of the pair applied thereto; a plurality of latch circuits, to which input data is applied in common, and which sample and output the input data at transition edges of clock signals of mutually shifted phases supplied from the interpolators corresponding to respective ones of the plurality of latch circuits; a phase detecting circuit for detecting and outputting phase, with respect to the clock, of a transition time point of the input data from the outputs of the plurality of latch circuits; a filter for smoothing the output of the phase detecting circuit; and a control circuit for outputting, based upon the output of the filter, a control signal for controlling an interior division ratio of the interpolators of the phase-shift circuit and a control signal for controlling selection of the clock pairs in the switch of the phase-shift circuit. The plurality of interpolators are divided into a plurality of groups in relation to control signals supplied from the control circuit in order to adjust the interior division ratio of the interpolators. The interpolators in the same group are supplied with the same control signal from the control circuit while the interpolators in different groups are supplied separately with respective ones of control signals from the control circuit.

According to another aspect of the present invention, the foregoing object is attained by providing a clock control method of a clock and data recovery circuit having a plurality of latch circuits to which input data is applied in common, the plurality of latch circuits sampling and outputting the input data at transition edges of clock signals of mutually shifted phases supplied to respective ones of the plurality of latch circuits; a phase detecting circuit for detecting and outputting phase, with respect to the clock, of a transition point of the input data from the outputs of the plurality of latch circuits; a filter for smoothing the output of the phase detecting circuit; and a control circuit for controlling the clock phase based upon the output of the filter; a plurality of pairs of clock signals being selected and output from among a plurality of clocks (referred to as a "multiphase clocks") of mutually different phases by a switch to which the multiphase clocks are supplied, and signals in which delay time is stipulated by time obtained by performing interior division of the phase difference between the clock signals of the pair being output by a plurality of interpolators to which respective ones of the plurality of clock pairs output from the switch are supplied; wherein changeover of selection of the clock pairs in the switch is controlled and interior division ratio of the interpolators is variably set based upon results of decoding the output of the filter, thereby varying phases of clock signals supplied to respective ones of the plurality of latch circuits; the plurality of interpolators are divided into a plurality of groups in relation to control signals supplied from the control circuit; interpolators in the same group are supplied with the same control signal from the control circuit; interpolators in different groups are supplied separately with control signals from the control circuit; and control is executed such that in a case where phases of the clock signals output from one group of interpolators have changed, the phases of clocks output from the interpolators of other groups do not change.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 5 is a timing waveform diagram useful in describing the operation of this embodiment;

PREFERRED EMBODIMENTS OF THE INVENTION

Figure 1:
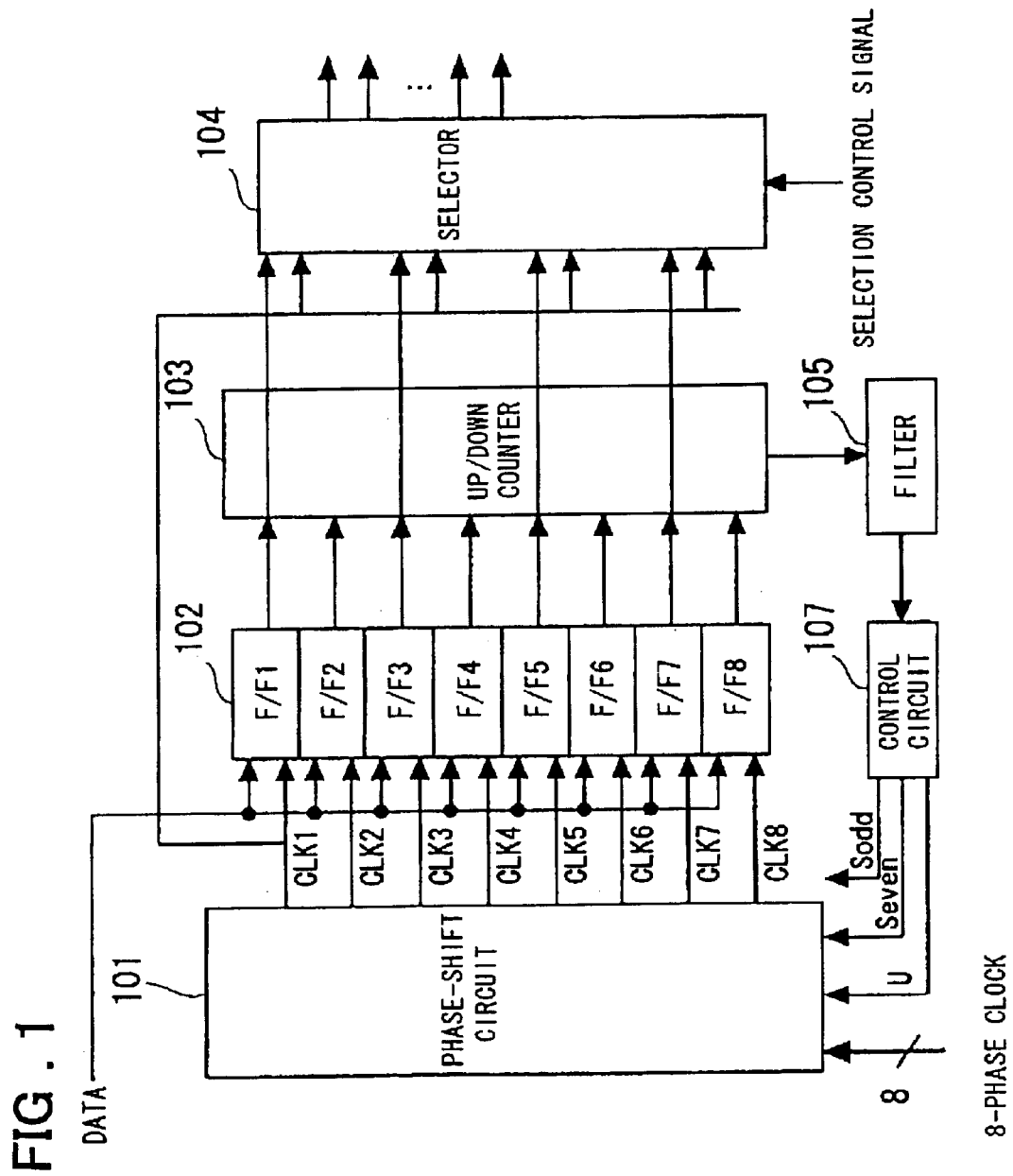
FIG. 1 is a diagram illustrating the structure of an embodiment according to the present invention.
Figure 2:
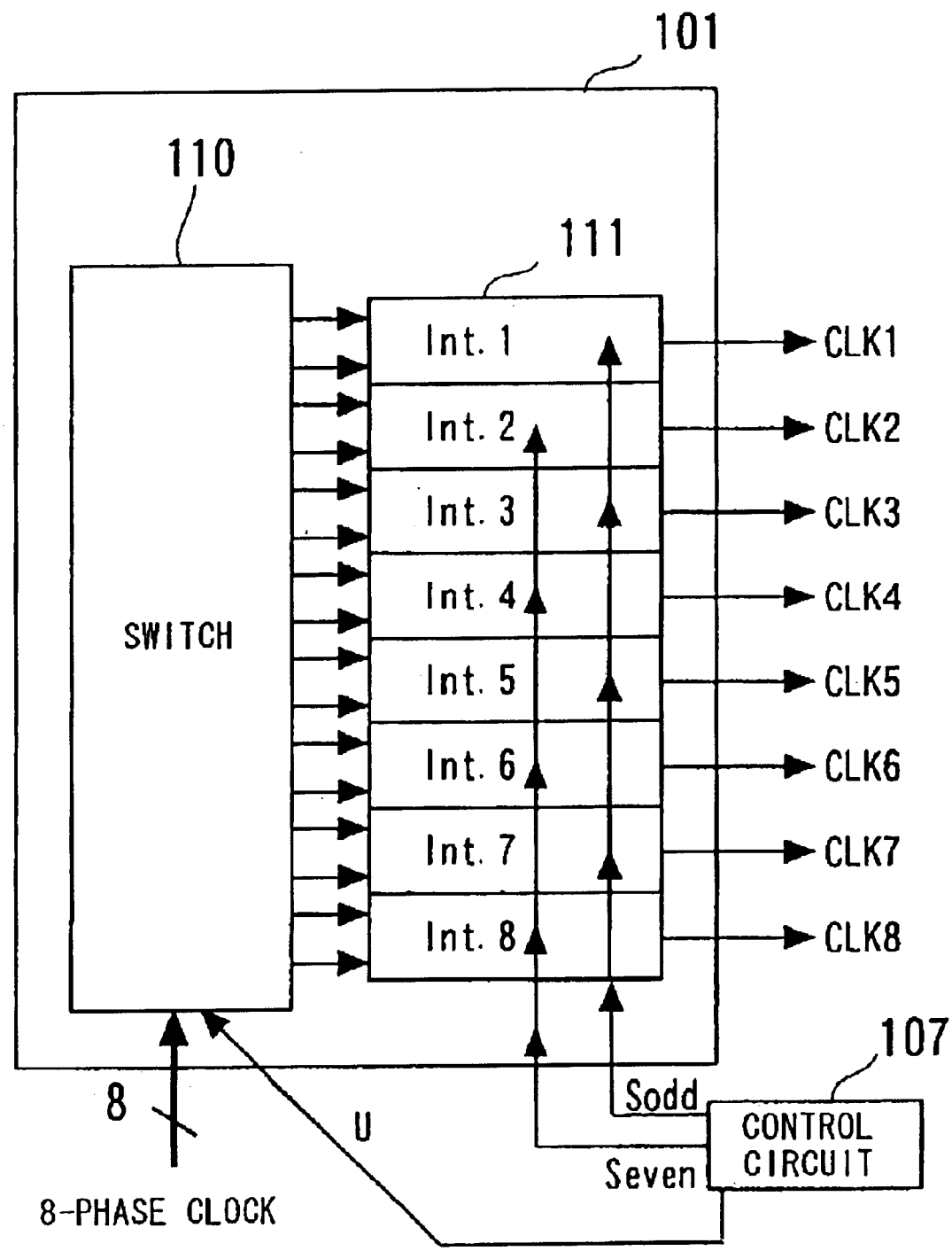
FIG. 2 is a diagram illustrating the structure of a phase-shift circuit according to this embodiment.

A mode of practicing the present invention will now be described with reference to the drawings. As shown in FIGS. 1 and 2, a clock and data recovery circuit according to a preferred mode of practicing the present invention comprises: a phase-shift circuit 101 which has a switch 110 that receives a plurality of clock signals of mutually different phases, and selects and outputs plural sets of clock pairs from among the plurality of clock signals, and a plurality of interpolators 111 (e.g., Int. 1 to Int. 8 in FIG. 2), each of which receives a clock pair output from the switch 110, and outputs a clock signal in which delay time is stipulated by time obtained by performing interior division of the phase difference between the clock pair at a predetermined interior division ratio; a plurality of latch circuits 102 (e.g., flip-flops F/F1 to F/F8) which sample input data at rising or falling edges of the clock signals (CLK1 to CLK8) output from respective ones of the interpolators 111; a counter 103 which counts up/down a count value in which outputs of the plurality of latch circuits 102 (F/F1 to F/F8) indicate counting up or counting down; a filter 105 which execute a time averaging of the output of the counter; and a control circuit 107 which decodes an output of the filter 105 and outputs a control signal U for controlling changeover of the switch 110 in the phase-shift circuit 101 and a control signal S for setting the division ratios of the interpolators 111. By way of example, the control circuit 107 outputs control signals Seven, Sodd for individually setting the division ratios of even-numbered and odd-numbered interpolators, respectively, in the phase-shift circuit 101. The structure and operation of these components will be described below.

Figure 12A:
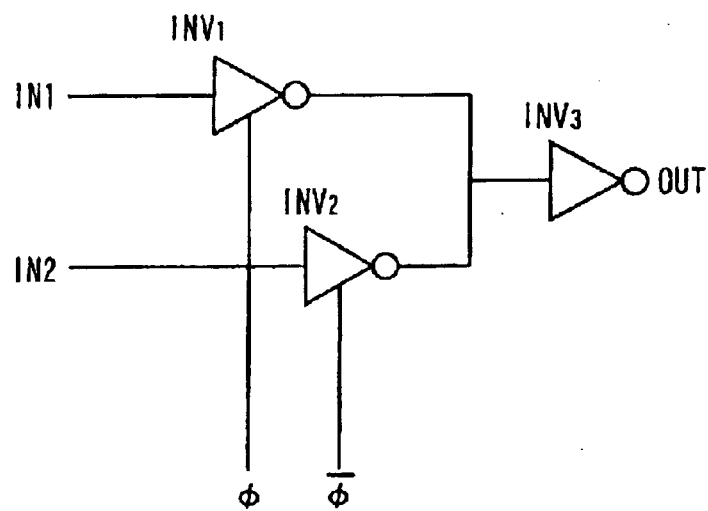
FIG. 12A is a diagram illustrating the structure of a phase interpolator according to the prior art.
Figure 12B:
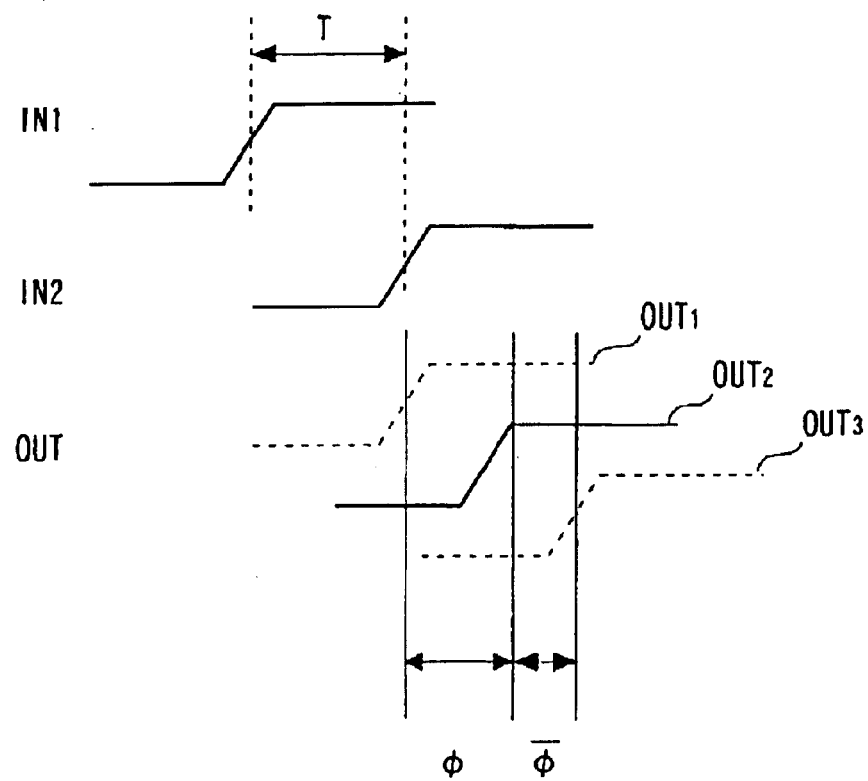
FIG. 12B is a timing diagram useful in describing the operating principle of internal division of phase difference in the interpolator.

The interpolators 111 (Int. 1 to Int. 8) comprise a first group of N-number of inverters (INV1 in FIG. 12A) which receive commonly a first input signal from a first input terminal and which are activated and deactivated by a first control signal supplied from the control circuit 107, and a second group of N-number of inverters (INV2 in FIG. 12A) which receive commonly a second input signal from a second input terminal and which are activated and deactivated by a second control signal, which is the inverted signal of the first control signal supplied from the control circuit 107. The outputs of the inverters of the first group and the outputs of the inverters of the second group are tied together and connected to the input terminal of a third inverter (INV3 in FIG. 12A). Let n $(0 \leq n \leq N)$ represent the number of inverters of the first group that are activated by the first control signal. The third inverter outputs a signal having a delay time stipulated by a time obtained by performing interior division of time T, which corresponds to the phase difference between the first and second input signals, at a ratio (N−n):n. The phase of the output signal is set in variable fashion.

The counter 103, which constitutes a phase detecting circuit, counts up/down the count value based upon the outputs of the plurality of latch circuits (F/F1 to F/F8)102, and the filter 105 comprises a digital filter (averaging filter).

The combination of clock pairs in the switch 110 is changed over based upon changeover signal U that is output from the control circuit 107, the interior division ratios of the odd- and even-numbered interpolators 111 are variably set separately based upon the control signals Sodd and Seven, respectively, that are output from the control circuit 107, and the phases of the clock signals output from the odd- and even-numbered interpolators 111 are controlled separately. As a result, even in a case where the control circuit 107 exercises control for advancing or delaying phase, depending upon jitter of the input data DATA, of the clock signal that samples the data changeover point, the phase of the clock for sampling the data bit remains as before without being immediately changed in association with the change in the phase of the clock signal that samples the data changeover point. In the embodiment of present invention, such control makes it possible to avoid erroneous sampling of data.

In this embodiment of the present invention, sets each composed of output data, which is delivered from the plurality of latch circuits (flip-flops F/F1 to F/F8), and a clock (e.g., a clock of one phase) output from the phase-shift circuit 101 are supplied to a selector (selection circuit) 104, which selects and outputs any set. Thus the number of parallel data and clock outputs can be varied freely.

Embodiments

A preferred embodiment of the present invention will now be described in further detail with reference to the drawings. FIG. 1 is a diagram illustrating the structure of a preferred embodiment of the invention. As shown in FIG. 1, a clock and data recover circuit according to the present embodiment of the clock and data recovery circuit according to the invention comprises a phase-shift circuit 101, a plurality of D-type flip-flops 102 (F/F1 to F/F8), a counter 103, a selector 104, a filter, and control circuit 107.

The phase-shift circuit 10 receives 8-phase clock signals, and outputs 8-sets of clock signals (CLK1–CLK8), which undergo phase shifting.

The D-type flip-flops 102 (F/F1 to F/F8) which have clock input terminals to which the clock signals output from the phase-shift circuit 101 are supplied, and data input terminals to which the input data DATA is supplied, sample the input data DATA at the rising edges of the clock signals.

The counter 103 counts up/down a count value responsive to up/down signals, wherein outputs of plural D-type flip-flops 102 serve as up signals when they are, e.g., logic "1" and down signals when they are logic "0".

The filter 105 executes time averaging of the output of the counter 103.

The control circuit 107 decodes the output of the filter 105 input thereto and supplies the phase-shift circuit 101 with signals Sodd, and Seven for controlling phase.

The selector (selection circuit) 104, receives a single-phase clock signal output from the phase-shift circuit 101 and output data signals of the D-type flip-flops 102 (F/F1 to F/F8) and outputs, in parallel, the selected sets (single-phase clock and sampled output data) based upon a selection control signal. In FIG. 1, the outputs of flip-flops F/F1, F/F3, F/F5, F/F7 from among the plurality of D-type flip-flops 102 (F/F1 to F/F8) are supplied to the selector 104. However, an arrangement in which the outputs of all of the flip-flops F/F1 to F/F8 are supplied to the selector 104 may be adopted.

The plural D-type flip-flops 102 (F/F1 to F/F8) sample and output the input data DATA at the rising edges (or falling edges) of the clock signals CLK1 to CLK8 output from the phase-shift circuit 101. The counter 103 counts the outputs of the plurality of D-type flip-flops 102, and the count is smoothed at a predetermined time constant by the filter 105. On the basis of this smoothed signal, control to advance or delay the phases of the clock signals supplied to the plurality of D-type flip-flops 102 is carried out. Thus, clock and data locked to the input data DATA are output.

FIG. 2 is a diagram illustrating the structure of the phase-shift circuit 101 according to this embodiment of the present invention. As shown in FIG. 2, the phase-shift circuit 101 includes the switch 110 which receives as inputs the 8-phase clock signal (8-phase CLK), and eight interpolators 111 (Int. 1 to Int. 8), each of which receives a clock pair output from the switch 110. The switch 110 comprises, e.g., a rotary switch and changes over the combination of output clock pairs based upon the output signal U output from the control circuit 107. The control circuit 107 supplies the control signal Sodd to the odd-numbered interpolators 111 (Int. 1, Int. 3, Int. 5, Int. 7) and supplies the control signal Seven to the even-numbered interpolators 111 (Int. 2, Int. 4, Int. 6, Int. 8).

Figure 3:
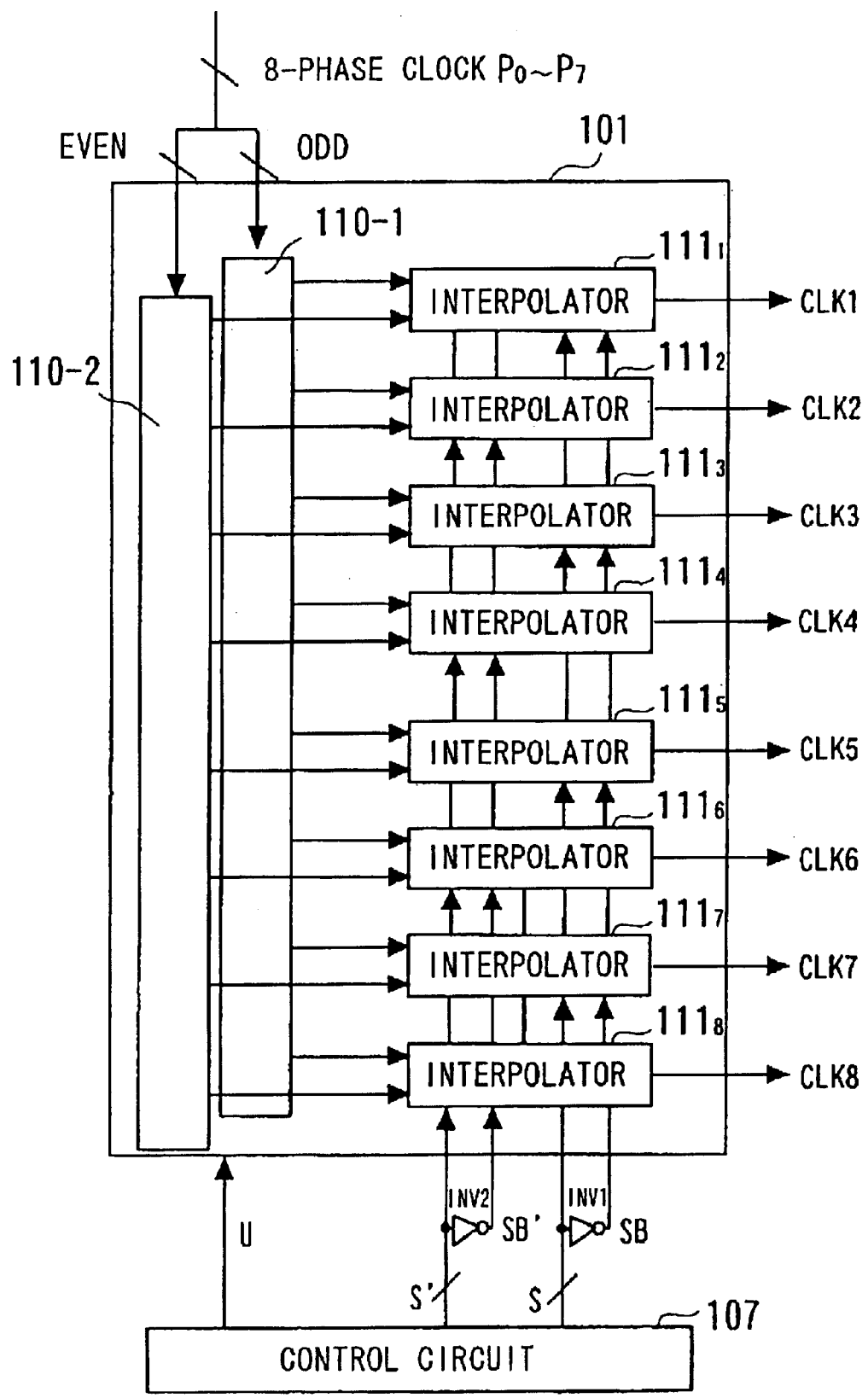
FIG. 3 is a diagram illustrating the structure of a switch in the phase-shift circuit of this embodiment.

FIG. 3 is a diagram illustrating the structure of the switch 110 (rotary switch) and interpolator 111 depicted in FIG. 2. The control circuit 107 includes a decoder (not shown) for outputting the control signal (changeover signal) U that controls changeover of the switch 110 and the control signal S that controls the interior division ratio of the first group of interpolators, and a comparator circuit (or hysteresis circuit) for outputting a control signal S' for controlling the division ratio of the second group of interpolators.

Figure 9:
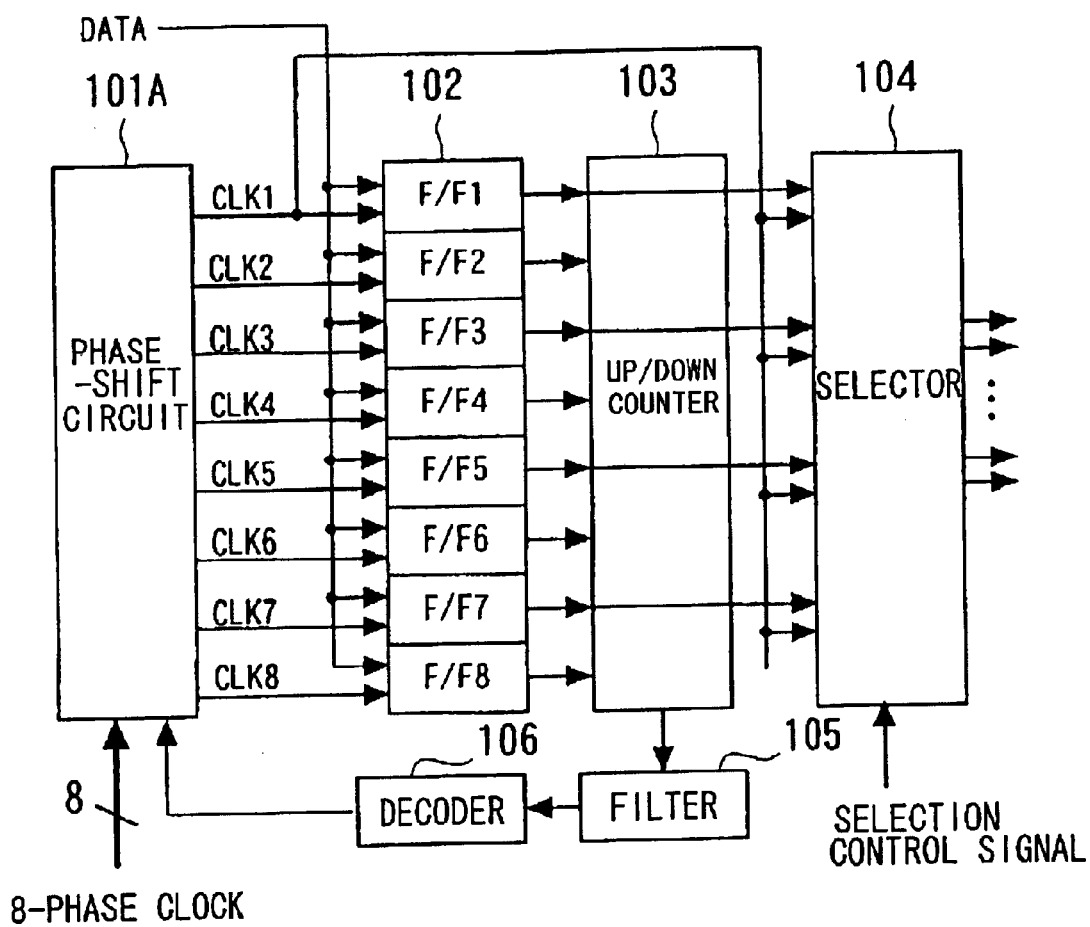
FIG. 9 is a diagram illustrating the structure of a clock and data recovery circuit disclosed in the specification of Japanese Patent Application No. 2000-389526 (Japanese Patent Kokai Publication JP-A-P2002-190724A)
Figure 10:
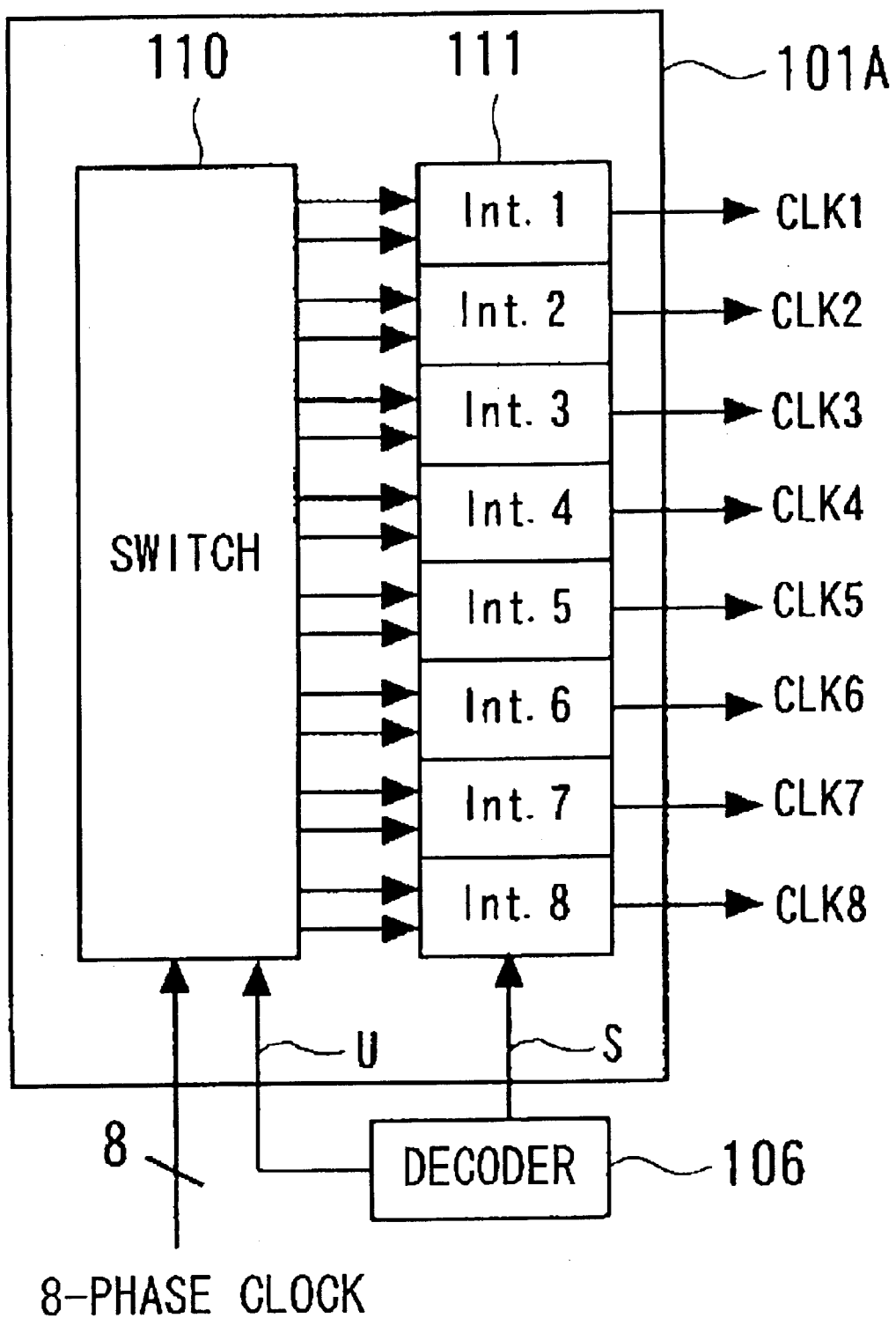
FIG. 10 is a diagram illustrating the structure of a phase-shift circuit disclosed in the specification of Japanese Patent Application No. 2000-389526 (Japanese Patent Kokai Publication JP-A-P2002-190724A)
Figure 11:
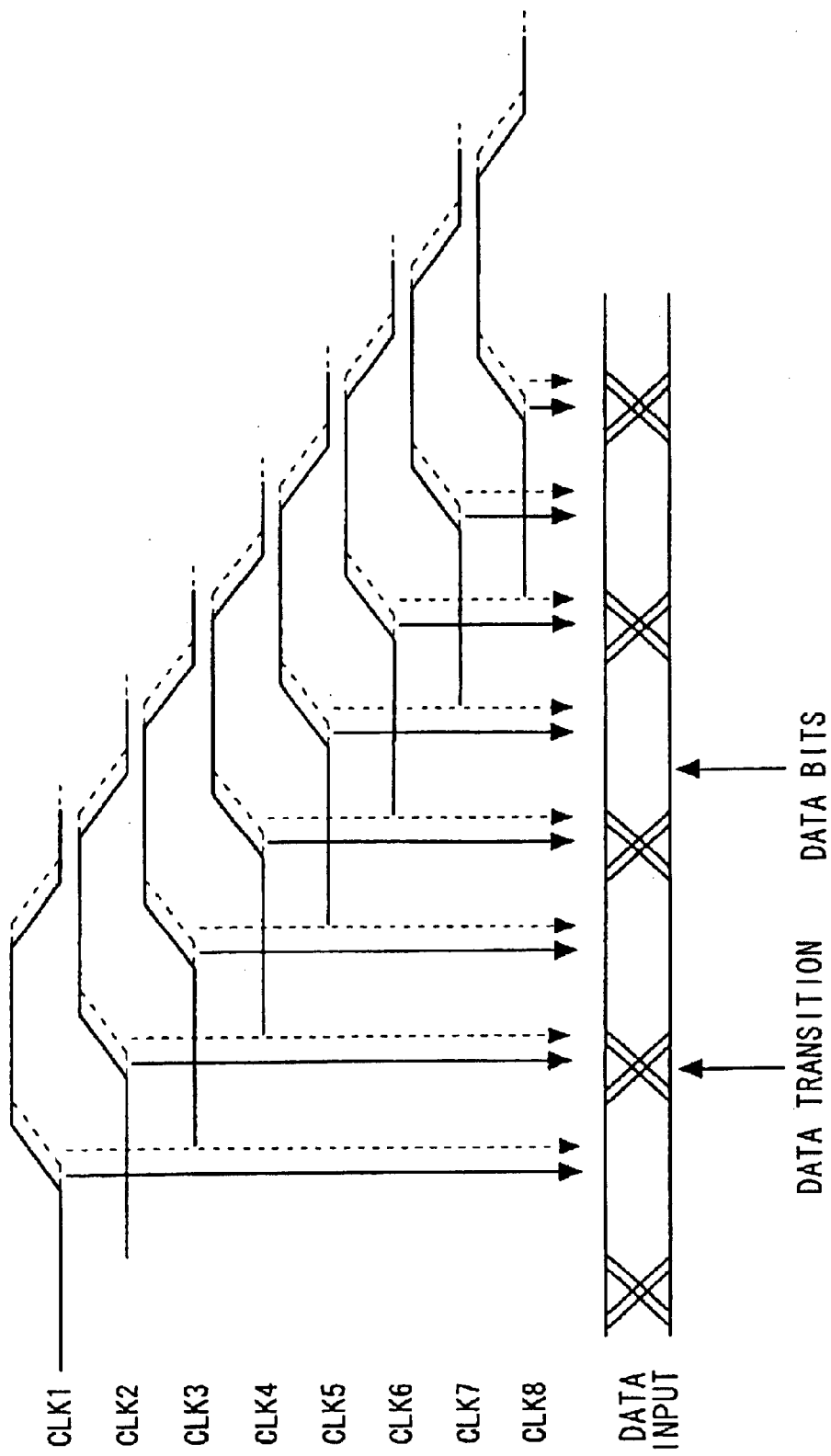
FIG. 11 is a timing diagram useful in describing the operation of Japanese Patent Application No. 2000-389526 (Japanese Patent Kokai Publication JP-A-P2002-190724A)

The decoder (not shown) in the control circuit 107 has a structure identical with that of the decoder 106 shown in FIGS. 9 and 10, decodes the output of the filter 105 and outputs the switch changeover signal U and control signal S for setting the interior division ratio of odd-numbered interpolators $111_1$, $111_3$, $111_5$ and $111_7$. In the decoder 106, the signal U of the four higher order bits is used to control changeover of the switch 110, and the signal S of the four lower order bits is used to control the 16-step interpolators $111_1$, $111_3$, $111_5$ and $111_7$. The 16-step control signal (four bits) supplied to these interpolators undergoes a thermometer-type shift. In a case where it is necessary to delay or advance phase with the 16-step control signal being all "1"s or all "0"s, the clock pairs are changed over in the switch 110 by the changeover signal U.

The comparator circuit (or hysteresis circuit) (either of which is shown) within the control circuit 107 outputs the control signal S' for setting the division ratio of the even-numbers interpolators $111_2$, $111_4$, $111_6$, and $111_8$. The 16-step control signal S' supplied to these interpolators undergoes a thermometer-type shift.

The control signal S and the signal obtained by inverting the control signal S by the inverter INV1 are supplied to the odd-numbered interpolators, and the control signal S' and the signal obtained by inverting the control signal S' by the inverter INV2 are supplied to the even-numbered interpolators.

In a case where the control circuit 107 is such that identical bits of the plurality of bits constituting the control signal S' continue a plurality of times, thereby specifying advance/delay of the phases of the corresponding interpolators, the control circuit 107 performs control to advance/delay the phases of the corresponding interpolators incrementally.

As shown in FIG. 3, the rotary switch includes a first switch 110-1, to which odd-numbered phase clock signals (P0, P2, P4 and P6) of the eight phase clock signals P0 to P7 are supplied, for selecting and outputting these to each of the interpolators 111, and a second switch 110-2, to which even-numbered phase clock signals (P1, P3, P5 and P7) of the multiphase clocks P0 to Pn are supplied, for selecting and outputting these to each of the interpolators 111. In the initial state (a state in which changeover control by the control circuit 107 has not been carried out), clock pairs (P0,P1), (P1,P2), (P2,P3), (P3,P4), (P4,P5), (P5,P6), (P6, P7), and (P7,P0), which are output from the first switch 110-1 and second switch 110-2, are supplied to the interpolators $111_1$ to $111_8$, respectively, by way of example.

If it is necessary to advance or delay phase further in a case where the phase-difference division ratio of the interpolators $111_1$ to $111_8$ has reached an upper or lower limit, the changeover signal U for changing over the combinations of clock pairs supplied to the interpolators $111_1$ to $111_8$ is output to the switches 110-1 and 110-2. For example, if clock phase is to be delayed by changing over the combinations of clock pairs in a case where the clock-pair combinations (P0,P1), (P1,P2), (P2,P3), (P3,P4), (P5,P6), (P6, P7) and (P7,P0) are being supplied to the interpolators 1111 to 1118, the changeover would be made so as to supply (P1,P2), (P2,P3), (P3,P4), (P5,P6), (P6,P7), (P7,P0) and (P0,P1). The switch 110 is referred to as a rotary switch because it rotates the clock-pair combinations.

Figure 4:
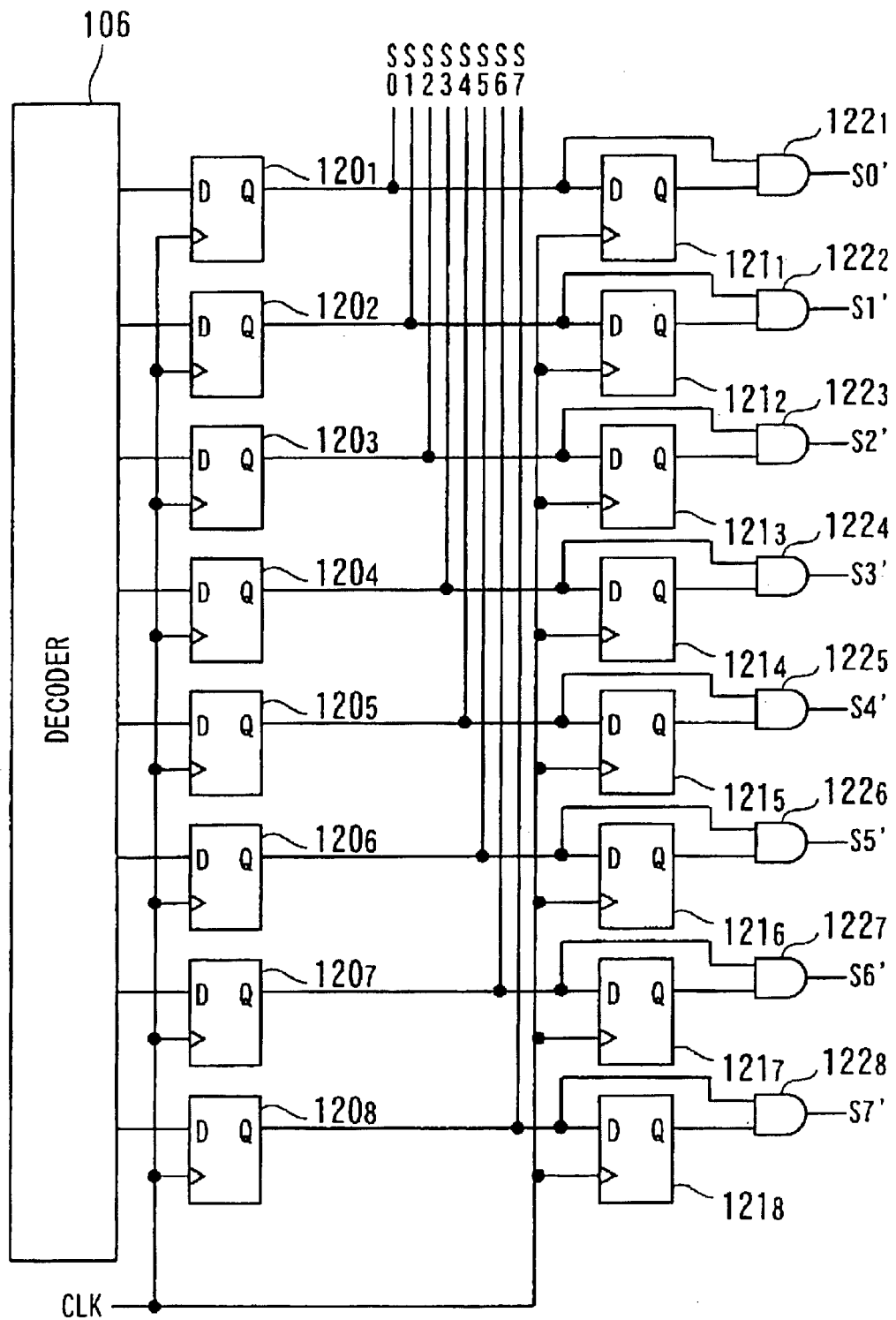
FIG. 4 is a diagram illustrating an example of the structure of a control circuit according to this embodiment.

FIG. 4 is a diagram illustrating an example of the structure of the control circuit 107 according to the embodiment of the invention shown in FIGS. 1 and 2. The arrangement of FIG. 4 includes the decoder 106, which is identical with the decoder shown in FIGS. 9 and 10. In FIG. 4, the decoder 106 outputs control signals S0 to S7 of eight bits. The interpolators whose interior division ratio is varied by these control signals of eight bits are 256-step interpolators.

The control signals of eight bits output from the decoder 106 in the control circuit 107 are latched by latch circuits $120_1$ to $120_8$ comprising D-type flip-flops and are extracted as control signals S0 to S7 for controlling the division ratios of the odd-numbered interpolators. The outputs of the latch circuits $120_1$ to $120_8$ are latched by latch circuits $121_1$ to $121_8$, respectively, comprising D-type flip-flops. The control circuit 107 further includes 2-input, 1-output logic gates $122_1$ to $122_8$ to which the outputs of the latch circuits $120_1$ to $120_8$, respectively, and the outputs of the latch circuits $121_1$ to $121_8$, respectively, are supplied. The outputs of the gates $122_1$ to $122_8$ are extracted as control signals S0' to S7' for controlling the interior division ratios of the even-numbered interpolators. In relation to FIG. 3, the control signals S0 to S7 and signals obtained by inverting the control signals S0 to S7 are supplied to the odd-numbered interpolators, and signals obtained by inverting the control signals S0' to S7' are supplied to the even-numbered interpolators.

The logic gates $122_1$ to $122_8$ comprise AND gates that output the high level when, e.g., two signals input to each of the logic gates $122_1$ to $122_8$ are both at the high level (when the value latched previously and the currently latched value are both logic "1"). Alternatively, an arrangement having hysteresis may be adopted, wherein logic "1" is output when the previously latched value is logic "0" and the currently latched value is logic "1". It should be noted that the circuit groups 121 and 122 constitute a group of comparator circuits (group of hysteresis circuits).

The arrangement of FIG. 4 is such that the value of the applicable bit of the corresponding control signal S' is set based upon two items of time-series data with regard to each bit of the control signals S0 to S7 in circuits 121, and 122. Of course, an alternative arrangement may be adopted in which if three or more items of time-series data are monitored with regard to each bit of the control signals S0 to S7 and agreement is achieved with a desired pattern, then the applicable bit of the control signal S' is changed.

FIG. 5 is a timing diagram useful in describing the operation of this embodiment of the invention. FIG. 5 illustrates clock signals CLK1 to CLK8 of eight phases output from the phase-shift circuit 101 and the waveform of the data input. In this example, clock signals CLK1, CLK3, CLK5 and CLK7 sample (latch the data) the data bits and clock signals CLK2, CLK4, CLK6 and CLK8 sample (i.e., perform edge detection) the changeover portions (transition points) of the input data in a case where the data changeover point and data bit are sampled in two phases [see Equation (1) above]. It will be understood that even in a case where the phases of clock signals for sampling the data changeover portion are shifted as indicated by the broken lines in the timing diagram of FIG. 5, the phases of the clock signals for sampling the data bit do not change and the value of the data bit is sampled correctly.

Figures 6A, 6B, 6C:
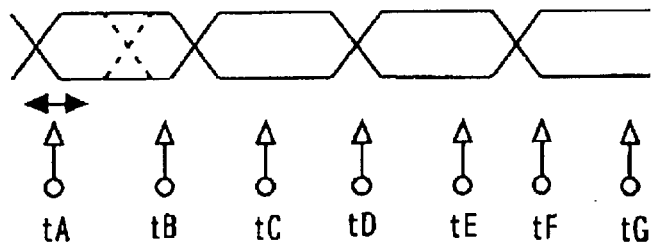
FIGS. 6A to 6C are diagrams useful in describing the operation of this embodiment.

FIGS. 6A, 6B and 6C are diagrams useful in describing the operation of this embodiment. FIG. 6A illustrates the data input, in which reference characters tA, tB, ~tG represent sampling points (times) based upon the multiphase clock. FIG. 6B illustrates an example of the control signals S0 to S7 and control signals S0' to S7' that are output from the control circuit 107 in correspondence with the sampling points tA, tB, ~tG.

Among the control signals S0 to S7 for controlling the phases of the interpolators that output the sampling clocks for detecting the data transition point, the value of S3 changes from moment to moment in the manner of logic "0", logic "1" owing to the effect of jitter or the like.

By contrast, with regard to signal S3' among the control signals S0' to S7' that control the phases of the sampling clock for latching the data bit, an instance in which logic "1" is attained over two cycles does not exist. Accordingly, the signal S3' remains at logic "0" owing to the circuit arrangement shown in FIG. 4.

That is, in the example shown in FIGS. 6A, 6B and 6C, control for advancing or retarding phase is carried out depending upon jitter or the like in the input data in the interpolators that supply the sampling clock for detecting the data transition point. However, in the interpolators that supply the sampling clock for the data bits, S0' to S7' do not change and the phases remain as they were originally.

Figure 7:
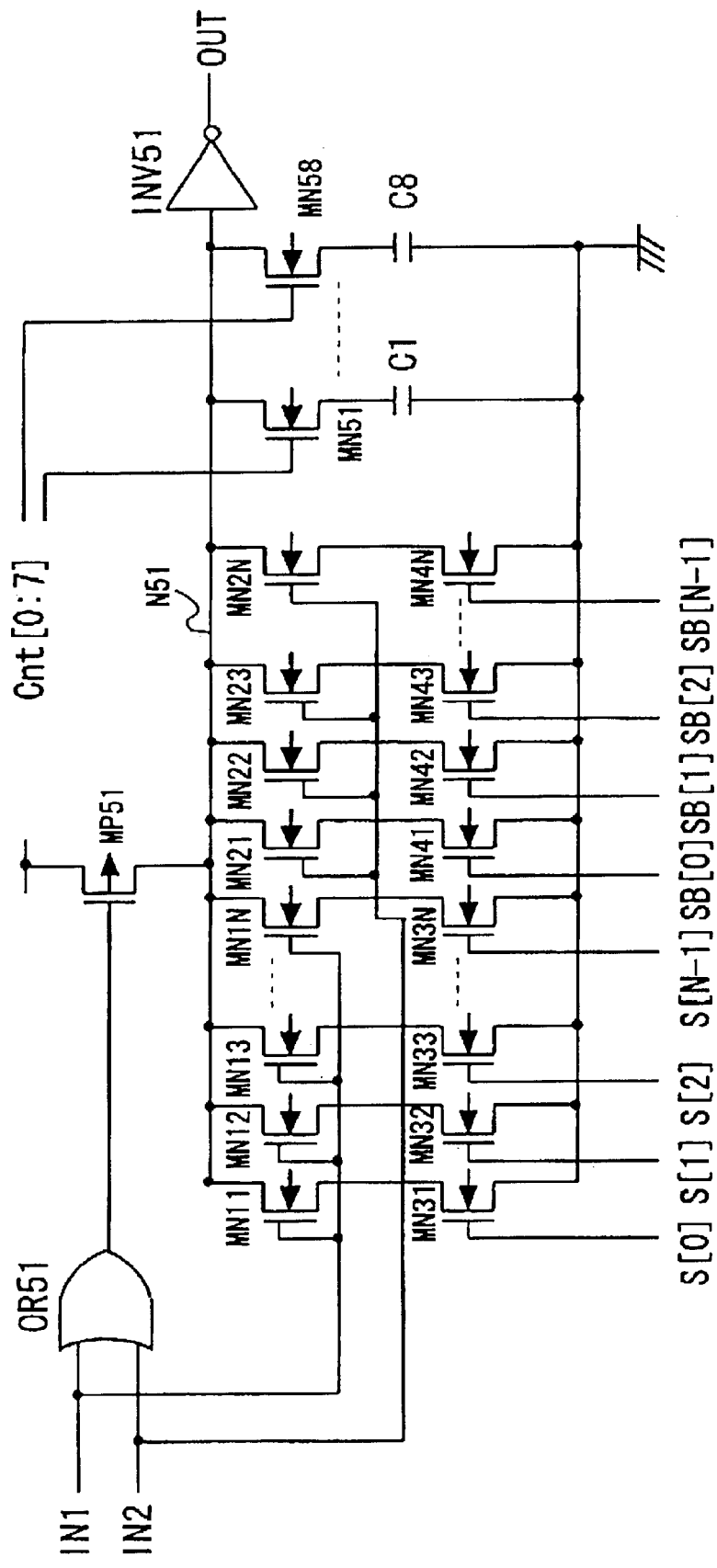
FIG. 7 is a diagram useful in describing an example of the structure of an interpolator according to this embodiment.
Figure 8:
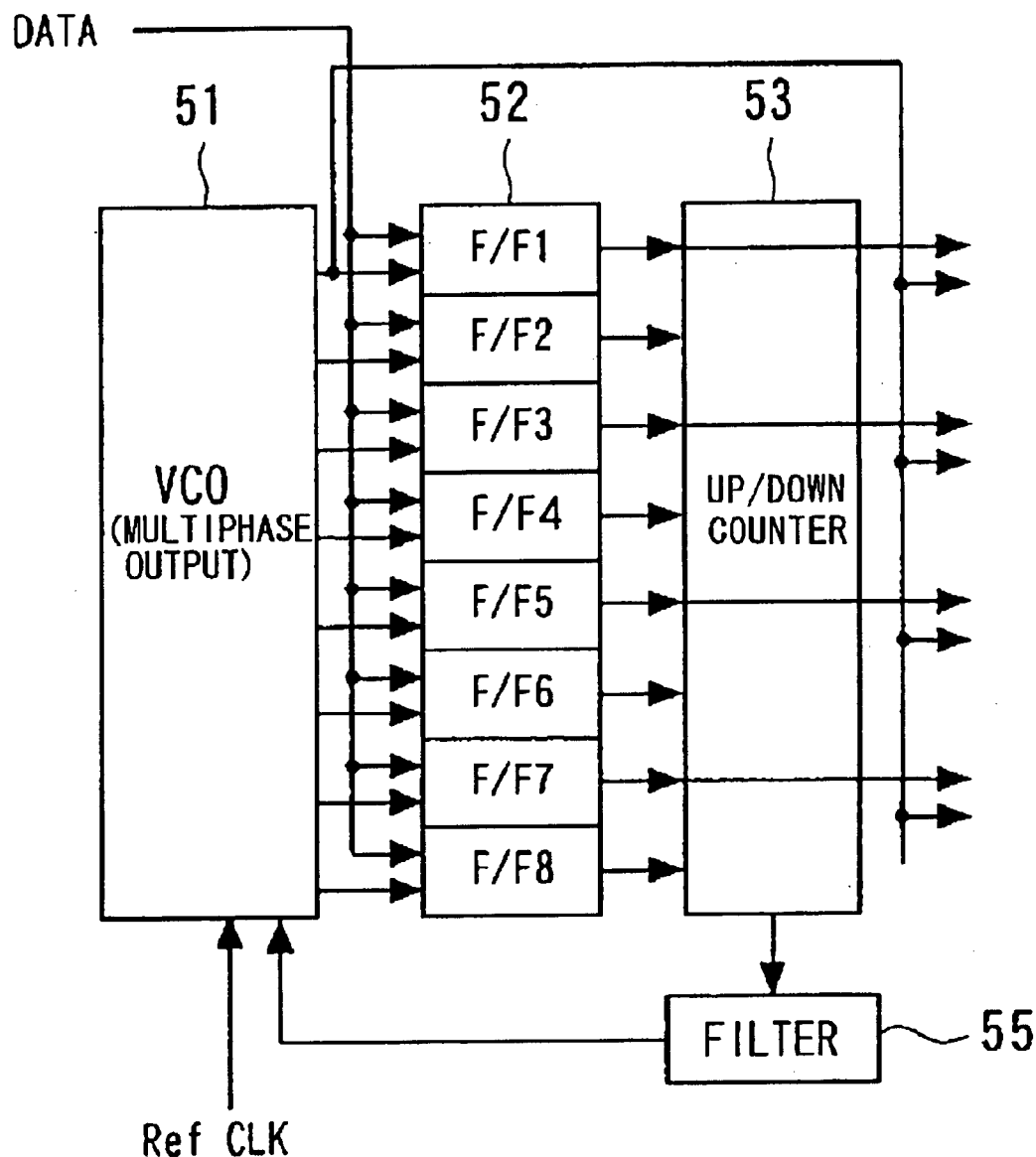
FIG. 8 is a diagram illustrating an example of the structure of a clock and data recovery circuit according to the prior art.

FIG. 7 is a diagram illustrating a specific example of the circuit configuration of the interpolator 111 at transistor level. As shown in FIG. 7, the interpolator includes a P-channel MOS transistor MP51, which is connected between a power source VDD and an internal node N51, turned on when the output signal of an OR gate 51, the inputs to which are IN1 and IN2, assumes the low level. A plurality of series circuits (MN51 and C1, . . . , MN58 and C8), each of which comprises an N-channel MOS transistor and a capacitor, are connected in parallel between the internal node N51 and ground. The interpolator further includes an inverter INV51, which has the internal node N51 connected to its input, for extracting an output signal OUT delivered from its output terminal. A control signal Cnt (0:7) connected to the gates of N-channel MOS transistors MN51 to MN58 may be set by the output of a frequency sensing circuit (not shown) for sensing the frequency of the clock signal. Alternatively, the control signal Cnt (0:7) may be decided by setting registers or dip switches, etc., to desired values in accordance with the particular application. The capacitance value applied to the node N51 can be varied by the control signal Cnt (0:7), thereby making it possible to widen the frequency range that can be supported.

The interpolator further includes 2N-number of parallel-connected N-channel MOS transistors MN11 to MN1N, MN21 to MN2N whose drains are connected to the internal node N51, and 2N-number of N-channel MOS transistors MN31 to MN3N, MN41 to MN4N whose drains are connected to the sources of the 2N-number of N-channel MOS transistors MN11 to MN1N, MN21 to MN2N, respectively, and whose sources are connected to ground. The input signal IN1 is connected as a common signal to the gates of N-number of the N-channel MOS transistors MN11 to MN1N, which are half of the above-mentioned 2N-number of N-channel MOS transistors, and the input signal IN2 is connected as a common signal to the gates of the N-number of N-channel MOS transistors MN21 to MN2N, which are other half of the above-mentioned 2N-number of N-channel MOS transistors.

A prescribed number of the N-channel MOS transistors MN31 to MN3N and of the N-channel MOS transistors MN41 to MN4N are turned on by control signals (N-bit control code) S[0] to S[N−1] and control signals (N-bit control code) SB[0] to SB[N−1] input to the gates of the N-channel MOS transistors MN31 to MN3N, MN41 to MN4N. The N-bit control signals S[0:N−1], SB[0:N−1] are supplied from the decoder 106, and signals SB[0] to SB[N−1] are applied as complementary signals obtained by inverting S[0] to S[N−1] by an inverter (inverter INV in FIG. 3).

The operator of the inverter will be described with reference to FIG. 7. When the input signals IN1, IN2 are at the low level, the P-channel MOS transistor MP51, to the gate of which the output of OR gate 51 is input, turns on, thereby charging capacitor C by the current from the power supply. The capacitance value is the combined capacitance value of capacitors among capacitors C1 to C8 connected to the N-channel MOS transistors MN51 to MN58 turned on by the control signal Cnt.

When the signal applied to the input signal IN1 undergoes a rise transition from the low level to the high level, the N-channel MOS transistors MN11 to MN1N are turned on and the charge that has accumulated in the capacitor C is partially discharged via a path composed of n-number of N-channel MOS transistors turned on by the control signals S[0] to S[N−1] from among the N-channel MOS transistors MN31 to MN3N having drains connected to the sources of the N-channel MOS transistors MN11 to MN1N and sources are connected to ground, and to the gates of which the control signals S[0] to S[N−1] are supplied.

When the input signal IN2 undergoes a rise transition from the low to the high level following a delay from the rising edge of the input signal IN1, the N-channel MOS transistors MN21 to MN2N are turned on and the charge that has accumulated in the capacitor C is partially discharged via a path composed of (N−n)-number of N-channel MOS transistors turned on by the control signals SB[0] to SB[N−1] from among the N-channel MOS transistors MN41 to MN4N having drains connected to the sources of the N-channel MOS transistors MN21 to MN2N and sources are connected to ground and to the gates of which the control signals S[0] to S[N−1] are supplied.

Let CV represent the electric charge that is discharged until the output of the inverter INV51, to which the terminal voltage of capacitor C is supplied, is switched to the high level. The charge is discharged at a current nI for the time of the phase difference (T) following the transition of the input signal IN1 to the high level. Next, the input signal IN1 undergoes a transition to the high level and the charge is discharged at a drain current NI of a total of N-number of N-channel MOS transistors, namely n-number of N-channel MOS transistors MN11 to MN1n and (N−n)-number of N-channel MOS transistors MN21 to MN2(N−n). The delay time tpd from the positive-going transition of the input signal IN2 from the low to the high level to the positive going transition of the output OUT is represented by the following equation:

$$tpd = (CV - n \cdot I \cdot T)/NI$$
$$= CV/NI - n \cdot T/N$$

and delay time can be varied in steps of T/N, where T is the phase difference between the inputs IN1 and IN2.

In FIG. 7, the positions of transistors MN11 to MN1N and transistors MN31 to MN3N and the positions of transistors MN21 to MN2N and transistors MN41 to MN4N may be interchanged. That is, it is of course permissible to adopt an arrangement in which the drains of the transistors MN31 to MN3N, to the gates of which the control signals S[0] to S[N−1], respectively, are supplied, are connected to the internal node N51; the transistors MN11 to MN1N, to the gates of which the input signal IN1 is input as a common signal, are connected between the sources of the transistors MN31 to MN3N and ground; the drains of the transistors MN41 to MN4N, to the gates of which the control signals SB[0] to SB[N−1], respectively, are supplied, are connected to the internal node N51; and the transistors MN21 to MN2N, to the gates of which the input signal IN2 is input as a common signal, are connected between the sources of the transistors MN41 to MN4N and ground.

In the present invention, the multiphase clock may be produced by the VCO of a PLL. In such case the clock is extracted from an inverter circuit of a prescribed stage of the VCO ring oscillator. Alternatively, the multiphase clock may be produced by a frequency multiplier of the multiphase clock. Further, it may be so arranged that the multiphase clock supplied to the phase-shift circuit 101 is generated using a multiphase clock generating circuit employing a frequency multiplying interpolator (multiphase-clock frequency dividing circuit) described in the specification of Japanese Patent Application No. 2000-389526 (Japanese Patent Kokai Publication JP-A-P2002-190724A). Though the present invention has been described in accordance with the foregoing embodiment, the invention is not limited to this embodiment and it goes without saying that the invention covers various modifications and changes that would be obvious to those skilled in the art within the scope of the claims.

The meritorious effects of the present invention are summarized as follows.

Thus, in accordance with the present invention as described above, resistance to the effects of data jitter is improved and data can be sampled correctly. The reason for this is that with regard to a plurality of interpolators that construct a phase-shift circuit for shifting the phases of a multiphase clock and outputting the resultant clock signals, the interpolators for controlling the phases of clock signals for edge detection of the input data signal and for data sampling are controlled separately.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit comprising:
    a phase-shift circuit having a switch, which receives multiphase clocks composed of a plurality of clock signals of mutually different phases, for selecting and outputting a plurality of clock pairs from among the multiphase clocks, and
    a plurality of interpolators, each receiving a clock pair output from said switch, and outputting a clock signal, delay time thereof being stipulated by time obtained by performing an interior division of the phase difference between the clock pair in accordance with an interior division ratio conforming to a control signal applied;
    a plurality of latch circuits, receiving input data in common;
    said plurality of latch circuits sampling and outputting the input data at transition edges of clock signals of mutually shifted phases supplied from said interpolators corresponding to respective ones of said plurality of latch circuits;
    a phase detecting circuit for detecting and outputting phase, with respect to the clock signal, of a transition point of the input data from the outputs of said plurality of latch circuits;
    a filter for smoothing the output of said phase detecting circuit; and
    a control circuit for outputting, based upon the output of said filter, a control signal for controlling interior division ratios of said interpolators of said phase-shift circuit and a control signal for controlling changeover of selection of the clock pairs in said switch of said phase-shift circuit;
    said plurality of interpolators being divided into a plurality of groups in relation to control signals supplied from said control circuit in order to adjust the interior division ratios of said interpolators;
    interpolators in the same group being supplied with the same control signal from said control circuit; and
    interpolators in different groups being supplied separately with respective ones of control signals from said control circuit.

2. The circuit according to claim 1, wherein among said plurality of interpolators, a first group of interpolators that output clock signals for sampling data bits of the input data and other groups of interpolators that output clock signals for sampling changeover portions of the input data are supplied separately from said control circuit with respective ones of control signals for setting interior division ratio.

3. The circuit according to claim 1, wherein among said plurality of interpolators, odd-numbered interpolators and even-numbered interpolators are supplied separately with respective ones of control signals for setting interior division ratio.

4. The circuit according to claim 1, wherein said control circuit has a circuit for monitoring, bit by bit in a time series, the control signals applied to the first group of interpolators, and performing control for changing applicable bits of the control signals applied to a second group of interpolators in a case where a pattern that coincides with a predetermined pattern has been detected in a time series in the control signals applied to the first group of interpolators.

5. The circuit according to claim 1, further comprising a selection circuit, which receives all or some of output signals of said plurality of latch circuits, for selecting which of these signals are output as output data.

6. The circuit according to claim 1, wherein said phase detecting circuit comprises a counter circuit for receiving and counting up or down outputs of said plurality of latch circuits.

7. The circuit according to claim 1, wherein each of said interpolators includes:
    a first group of N-number of inverters which receive a first input signal from a first input terminal as a common input and which are activated and deactivated by a first control signal supplied from said control circuit; and
    a second group of N-number of inverters which receive a second input signal from a second input terminal as a common input and which are activated and deactivated by a second control signal, that is an inverted signal of the first control signal supplied from said control circuit;

output terminals of the inverters of said first group and output terminals of the inverters of said second group are tied together and connected to an input terminal of a third inverter; and said third inverter outputs a signal having a delay time stipulated by a time obtained by performing an interior division of time T, which corresponds to phase difference between the first and second input signals, at a ratio (N−n):n, where n (0=<n=<N) represents the number of inverters of said first group that are activated by the first control signal.

8. The circuit according to claim 1, wherein each of said interpolators includes:

a logic circuit receiving the first and second input signals from the first and second input terminals;

a switch inserted between a first power supply and an internal node, for being turned on when an output signal from said logic circuit is at a first logic value; and a buffer circuit, having an input terminal connected to the internal node, for inverting the output logic value if a relationship between magnitude of potential at the internal node and magnitude of a threshold value is inverted;

N-number of parallel-connected second switches, each having one end connected to the internal node and having a control terminal to which the first input signal from the first input terminal is supplied;

N-number of parallel-connected third switches, each having one end connected to the internal node and having a control terminal to which the second input signal from the second input terminal is supplied;

N-number of fourth switches inserted in parallel between other ends of said second switches and a second power supply and each having a control terminal to which a control signal from said control circuit is connected for turning said fourth switches on and off; and N-number of fifth switches inserted in parallel between other ends of said third switches and the second power supply and each having a control terminal to which a control signal from said control circuit is connected for turning said fifth switches on and off.

9. The circuit according to claim 1, wherein each of said interpolators includes:

a logic circuit receiving the first and second input signals from the first and second input terminals;

a switch, inserted between a first power supply and an internal node, for being turned on when an output signal from said logic circuit is at a first logic value; and a buffer circuit, having an input terminal to which the internal node is connected, for inverting the output logic value if a relationship between magnitude of potential at the internal node and magnitude of a threshold value is inverted;

N-number of parallel-connected second switches, each having one end connected to the internal node and having a control terminal to which a control signal from said control circuit is connected for turning said second switches on and off;

N-number of parallel-connected third switches, each having one end connected to the internal node and having a control terminal to which a control signal from said control circuit is connected for turning said second third switches on and off;

N-number of parallel-connected fourth switches inserted in parallel between other ends of said second switches and a second power supply and each having a control terminal to which the first input signal from the first input terminal is supplied; and N-number of parallel-connected fifth switches inserted in parallel between other ends of said fourth switches and the second power supply and each having a control terminal to which the second input signal from the second input terminal is supplied.

10. The circuit according to claim 8, further comprising a plurality of series circuits, each comprising a sixth switch and a capacitor, inserted in parallel between the internal node and the second power supply.

11. The circuit according to claim 1, wherein said control circuit sets the interior division ratios of said interpolators based upon a value obtained by averaging an output from said phase detecting circuit over time by said filter; and if the interior division ratio of an interpolator reaches a set upper-limit value or lower-limit value and it is necessary to perform an adjustment to further delay or advance phase of the output signal of said interpolator, then a control signal for changing over combinations of clock pairs is output to said switch that selects and outputs the clock signals supplied to said interpolator.

12. The circuit according to claim 9, further comprising a plurality of series circuits, each comprising a sixth switch and a capacitor, inserted in parallel between the internal node and the second power supply.

13. A clock control method of a clock and data recovery circuit having a plurality of latch circuits receiving input data in common, for sampling and outputting the input data at transition edges of clock signals of mutually shifted phases supplied to respective ones of said plurality of latch circuits; a phase detecting circuit for detecting and outputting phase, with respect to a clock signal, of a changeover portion of the input data from the outputs of said plurality of latch circuits; a filter for smoothing the output of said phase detecting circuit; and a control circuit for controlling the phases of the clock signals based upon the output of said filter;

a plurality of clock pairs being selected and output from among multiphase clocks composed of a plurality of clock signals of mutually different phases by a switch which receives the multiphase clocks; and signals in which delay time is stipulated by time obtained by performing interior division of the phase difference between the clock pairs output by a plurality of interpolators which receives respective ones of the plurality of clock pairs output from said switch; said method comprising the steps of:

controlling changeover of selection of the clock pairs in said switch and variably setting division ratios of said interpolators based upon results of decoding the output of said filter, thereby varying phases of clock signals supplied to respective ones of said plurality of latch circuits;

dividing said plurality of interpolators into a plurality of groups in relation to control signals supplied from said control circuit;

supplying interpolators in the same group with the same control signal from said control circuit;

supplying interpolators in different groups separately with respective ones of control signals from said control circuit; and executing control such that in a case where phases of the clock signals output from one group of interpolators have changed, the phases of clocks output from the interpolators of other groups do not change.

14. The method according to claim 13, wherein among said plurality of interpolators, a first group of interpolators that output clock signals for sampling data bits of the input data and other groups of interpolators that output clock signals for sampling changeover portions of the input data are supplied separately from said control circuit with respective ones of control signals for setting division ratio.

15. The method according to claim 13, wherein among said plurality of interpolators, odd-numbered interpolators and even-numbered interpolators are supplied separately with respective ones of control signals for setting division ratio.

* * * * *